United States Patent
Liao

(10) Patent No.: US 9,123,684 B2
(45) Date of Patent: Sep. 1, 2015

(54) CHIP PACKAGE STRUCTURE AND MANUFACTURING METHOD THEREOF

(71) Applicant: ChipMOS Technologies Inc., Hsinchu (TW)

(72) Inventor: Tsung-Jen Liao, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 14/304,975

(22) Filed: Jun. 15, 2014

(65) Prior Publication Data

US 2015/0162260 A1 Jun. 11, 2015

(30) Foreign Application Priority Data

Dec. 11, 2013 (TW) .............................. 102145621 U

(51) Int. Cl.

| | |
|---|---|
| H01L 23/34 | (2006.01) |
| H01L 23/04 | (2006.01) |
| H01L 23/10 | (2006.01) |
| H01L 23/13 | (2006.01) |
| H01L 23/14 | (2006.01) |
| H01L 23/31 | (2006.01) |
| H01L 23/495 | (2006.01) |
| H01L 21/48 | (2006.01) |
| H01L 23/00 | (2006.01) |
| H01L 23/29 | (2006.01) |
| H01L 23/367 | (2006.01) |

(52) U.S. Cl.
CPC ............ *H01L 23/34* (2013.01); *H01L 21/4882* (2013.01); *H01L 23/13* (2013.01); *H01L 23/142* (2013.01); *H01L 23/293* (2013.01); *H01L 23/3157* (2013.01); *H01L 23/3677* (2013.01); *H01L 23/495* (2013.01); *H01L 24/82* (2013.01); *H01L 24/83* (2013.01)

(58) Field of Classification Search
None
See application file for complete search history.

(56) References Cited

U.S. PATENT DOCUMENTS

| | | | | |
|---|---|---|---|---|
| 5,285,352 A | * | 2/1994 | Pastore et al. | 361/707 |
| 5,506,755 A | * | 4/1996 | Miyagi et al. | 361/720 |
| 5,604,376 A | * | 2/1997 | Hamburgen et al. | 257/676 |
| 5,923,084 A | * | 7/1999 | Inoue et al. | 257/712 |
| 6,696,643 B2 | * | 2/2004 | Takano | 174/520 |
| 6,777,788 B1 | * | 8/2004 | Wan et al. | 257/670 |
| 6,909,168 B2 | * | 6/2005 | Minamio et al. | 257/670 |
| 7,009,288 B2 | * | 3/2006 | Bauer et al. | 257/690 |
| 7,087,986 B1 | * | 8/2006 | Bayan et al. | 257/676 |
| 7,368,806 B2 | * | 5/2008 | Liu et al. | 257/676 |

(Continued)

FOREIGN PATENT DOCUMENTS

| | | | | | |
|---|---|---|---|---|---|
| JP | 05160289 A | * | 6/1993 | ............ | H01L 23/12 |
| JP | 2004-228603 | * | 8/2004 | ............ | H01L 23/28 |

*Primary Examiner* — Joseph Schoenholtz
(74) *Attorney, Agent, or Firm* — Jianq Chyun IP Office

(57) ABSTRACT

A chip package structure including a leadframe, a chip, at least one heat dissipation pillar, and a molding compound is provided. The leadframe includes a die pad and a plurality of leads. The die pad has at least one through hole. The leads surround the die pad. The chip is located on the die pad and electronically connected to the leads. The chip includes an active surface and a back surface opposite to the active surface. The back surface of the chip is adhered to the die pad. The heat dissipation pillar is located on the back surface and passes through the through hole. The molding compound encapsulates the chip, at least parts of the leads, and the die pad. The molding compound includes at least one opening to expose the heat dissipation pillar. A manufacturing method of the chip package structure is also provided.

18 Claims, 6 Drawing Sheets

(56) References Cited

U.S. PATENT DOCUMENTS

| | | | |
|---|---|---|---|
| 7,872,869 B2* | 1/2011 | Lee et al. | 361/719 |
| 8,330,270 B1* | 12/2012 | Lin et al. | 257/723 |
| 8,619,428 B2* | 12/2013 | Lee et al. | 361/720 |
| 2005/0242417 A1* | 11/2005 | Youn et al. | 257/676 |
| 2006/0151862 A1* | 7/2006 | Lin et al. | 257/676 |
| 2006/0170081 A1* | 8/2006 | Gerber et al. | 257/666 |

* cited by examiner

CHIP PACKAGE STRUCTURE AND MANUFACTURING METHOD THEREOF

CROSS-REFERENCE TO RELATED APPLICATION

This application claims the priority benefit of Taiwan application serial no. 102145621, filed on Dec. 11, 2013. The entirety of the above-mentioned patent application is hereby incorporated by reference herein and made a part of this specification.

BACKGROUND OF THE INVENTION

1. Field of the Invention

The invention relates to a semiconductor package structure and a manufacturing method thereof; more particularly, the invention relates to a chip package structure and a manufacturing method thereof.

2. Description of Related Art

In the semiconductor industries, the production of integrated circuits (IC) mainly contains three stages: wafer fabrication, IC fabrication, and IC package. Chips (dies) are manufactured by performing steps of wafer fabrication, circuit design, photomask fabrication, cutting the wafer, and so on. Each individual chip obtained by cutting the wafer can be electrically connected to external signals via contacts on the chip, and a molding compound may then be employed to encapsulate the chip. The IC packaging process is thus completed. Said packaging process is to prevent the chip from being affected by moisture, heat, noises, and so forth; at the same time, the packaging process is able to provide a medium for electrical connection between the chip and the external circuit.

With the enhanced IC integration, the chip package structure tends to become more and more complicated and diversified. In order to improve the heat dissipation performance of the chip package structure, a heat sink is often configured on the chip package structure. The heat sink is adhered to the surface of the package structure by means of an adhesive or solder according to the related art; however, the adhesive or solder cannot guarantee that the heat sink is able to be fixed onto the package structure, and it is likely for the heat sink to be detached from or to fall off from the package structure. Thereby, the production yield and reliability of the resultant product may be negatively affected, and there may be additional costs of the heat sink.

SUMMARY OF THE INVENTION

The invention is directed to a chip package structure capable of enhancing heat dissipation efficiency and economizing production costs.

The invention is also directed to a manufacturing method of a chip package structure; by applying the manufacturing method, the resultant chip package structure allows heat dissipation efficiency to be enhanced and allows production costs to be economized.

In an embodiment of the invention, a chip package structure that includes a leadframe, a chip, at least one heat dissipation pillar, and a molding compound is provided. The leadframe includes a die pad and a plurality of leads. The die pad has at least one through hole. The leads surround the die pad. The chip is located on the die pad and electronically connected to the leads. The chip includes an active surface and a back surface opposite to the active surface. The back surface of the chip is adhered to the die pad. The heat dissipation pillar is located on the back surface and passes through the through hole. The molding compound encapsulates the chip, at least parts of the leads, and the die pad. The molding compound includes at least one opening to expose the heat dissipation pillar.

In an embodiment of the invention, a manufacturing method of a chip package structure includes following steps. A wafer is provided. The wafer has an active surface and a back surface opposite to the active surface. The active surface of the wafer has a conductive pattern, and the wafer includes a plurality of chips connected together and arranged in an array. A patterned dry film layer having a plurality of vias is formed on the back surface of the wafer. A plating process is performed with use of the patterned dry film layer as a mask to form a plurality of heat dissipation pillars respectively in the vias. The patterned dry film layer is removed. The wafer is cut to separate the chips. Each of the chips has at least one of the heat dissipation pillars. A leadframe is provided. The leadframe includes a die pad and a plurality of leads. The die pad has at least one through hole. The leads surround the die pad. One of the chips is configured onto the die pad and is electrically connected to the leads, and at least one of the heat dissipation pillars of the one of the chips passes through the at least one through hole. A molding compound is provided to encapsulate the chips, at least parts of the leads, and the die pad. The molding compound includes at least one opening that exposes the heat dissipation pillars.

According to an embodiment of the invention, the number of the at least one heat dissipation pillar is plural.

According to an embodiment of the invention, the heat dissipation pillars are located in the at least one through hole, and the at least one opening exposes the heat dissipation pillars.

According to an embodiment of the invention, the number of the at least one opening is plural. The openings respectively expose the heat dissipation pillars.

According to an embodiment of the invention, the number of the at least one through hole is plural. The heat dissipation pillars are respectively located in the through holes.

According to an embodiment of the invention, the at least one opening at least exposes a top surface of the at least one heat dissipation pillar.

According to an embodiment of the invention, the chip package structure further includes a plurality of conductive wires. The conductive wires are electrically connected to the chip and the leads, respectively.

According to an embodiment of the invention, each of the leads includes an inner lead and an outer lead. The conductive wires are electrically connected to the chip and the inner lead, respectively.

According to an embodiment of the invention, the molding compound encapsulates the inner lead.

According to an embodiment of the invention, there is a height difference between an upper surface of the die pad configured to carry the chips and an upper surface of each of the leads configured to be electrically connected to the chips.

According to an embodiment of the invention, the at least one opening exposes at least one portion of the die pad.

In view of the above, the heat dissipation pillar of the chip package structure is directly plated onto the back surface of the chip, and the chip is located on the die pad of the leadframe. The heat dissipation pillar passes through the through hole of the die pad, and the molding compound includes the opening corresponding to the heat dissipation pillar, so as to expose the heat dissipation pillar. Thereby, the chip package structure described in an embodiment of the invention may directly dissipate the heat generated by the chip to the surroundings by means of the heat dissipation pillar exposed by the molding compound. As a result, the chip package structure described in an embodiment of the invention is indeed able to enhance its heat dissipation performance and reduce costs of additional heat dissipation components, such as heat dissipation paste or heat sink.

In order to make the aforementioned and other features and advantages of the invention comprehensible, embodiments accompanied with figures are described in detail below.

DETAILED DESCRIPTION OF DISCLOSED EMBODIMENTS

It is to be understood that the foregoing and other detailed descriptions, features, and advantages are intended to be described more comprehensively by providing embodiments accompanied with figures hereinafter. In the following embodiments, wordings used to indicate directions, such as "up," "down," "front," "back," "left," and "right", merely refer to directions in the accompanying drawings. Thus, the language used to describe the directions is not intended to limit the scope of the invention. Moreover, in the following embodiments, identical or similar components share the identical or similar reference numbers.

Figure 1A:
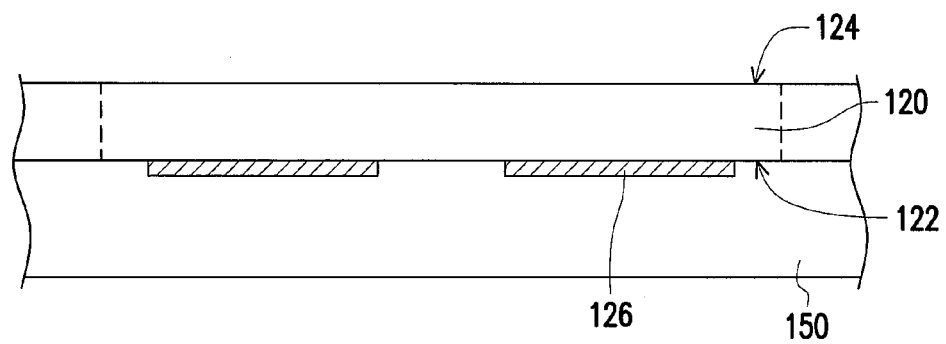
FIG. 1A to FIG. 1G are schematic cross-sectional flowcharts illustrating a manufacturing method of a chip package structure according to an embodiment of the invention.

FIG. 1A to FIG. 1G are schematic cross-sectional flowcharts illustrating a manufacturing method of a chip package structure according to an embodiment of the invention. The manufacturing method of the chip package structure described in the present embodiment includes following steps. With reference to FIG. 1A, a wafer is provided, and the wafer shown in FIG. 1A includes an active surface 122, a back surface 124 opposite to the active surface 122, and a conductive pattern 126. The wafer has a plurality of chips 120 connected together and arranged in an array. For the purpose of clear illustration, note that FIG. 1A merely shows one of the chips 120 of the wafer arranged in an array, i.e., the chip 120 may be a wafer-level chip. In addition, according to the present embodiment, the conductive pattern 126 may be plated onto the active surface 122 of the wafer and may serve as an under-bump metallization (UBM) layer or a redistribution layer (RDL) of each chip 120. The active surface 122 of the wafer described herein may be configured on a base 150 that may cover the conductive pattern 126 as shown in FIG. 1A and may be an adhesive tape or a dry film, for instance.

Figure 1B:
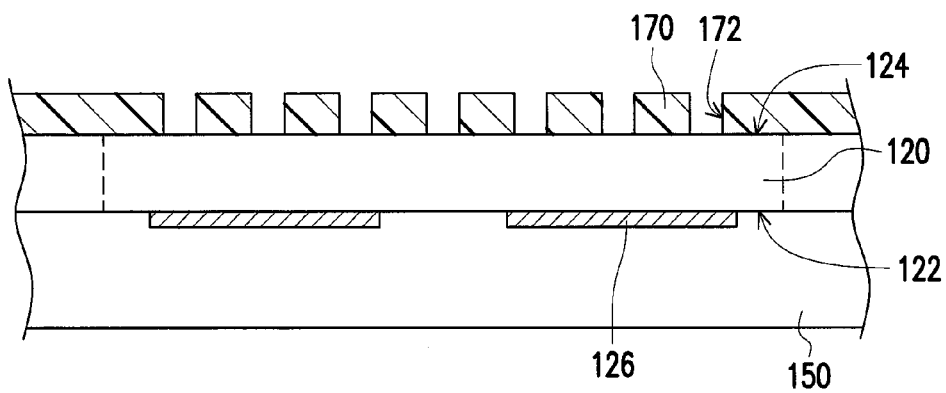
Figure 1C:
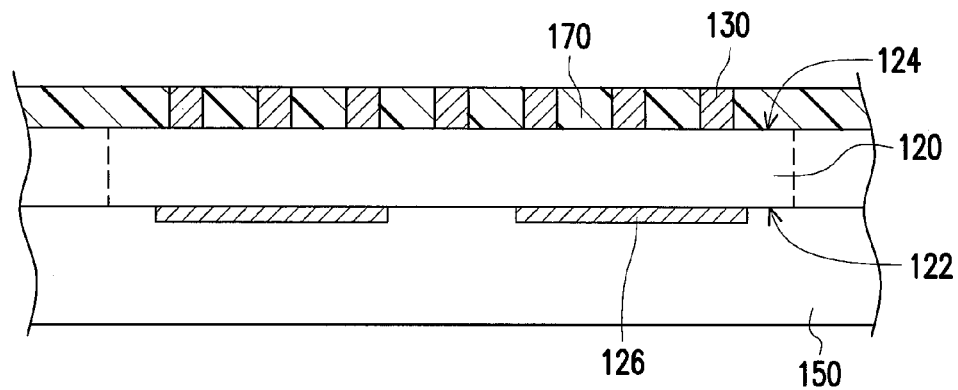
Figure 1D:
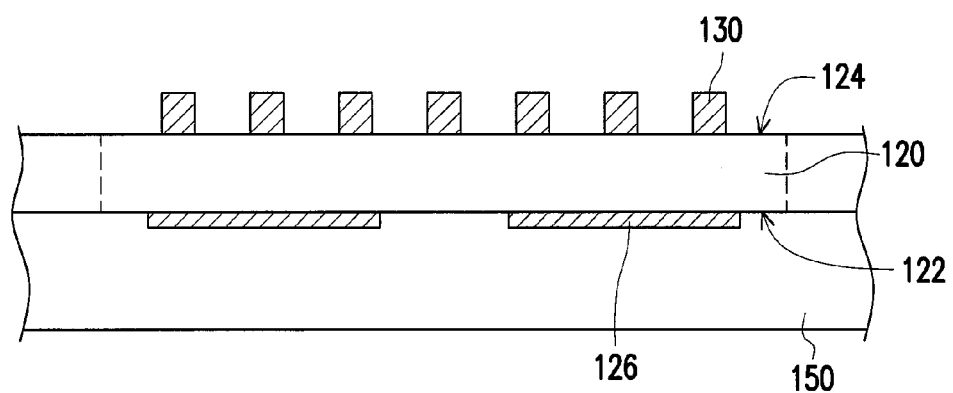

With reference to FIG. 1B, a patterned dry film layer 170 having a plurality of vias 172 is formed on the back surface 124 of the chip 120, and a plating process is performed with use of the patterned dry film layer 170 as a mask, so as to form a plurality of heat dissipation pillars 130 (shown in FIG. 1C) respectively in the vias 172. That is, the heat dissipation pillars 130 are formed on parts of the back surface 124 exposed by the vias 172. Here, each chip 120 has at least one of the heat dissipation pillars 130, and the heat dissipation pillars 130 are not electrically connected to other circuit layers on the back surface 124. The patterned dry film layer is then removed to expose the back surface 124 and the heat dissipation pillars 130 formed on the back surface 124. In another embodiment, the heat dissipation pillars 130 and the conductive pattern 126 on the chip 120 are formed onto the wafer in advance by performing said manufacturing steps, and the wafer is then cut to separate the chips 120. In the present embodiment, the wafer may be cut along the cutting line shown in FIG. 1D, so as to obtain a plurality of chips for performing the subsequent manufacturing steps.

Figure 1E:
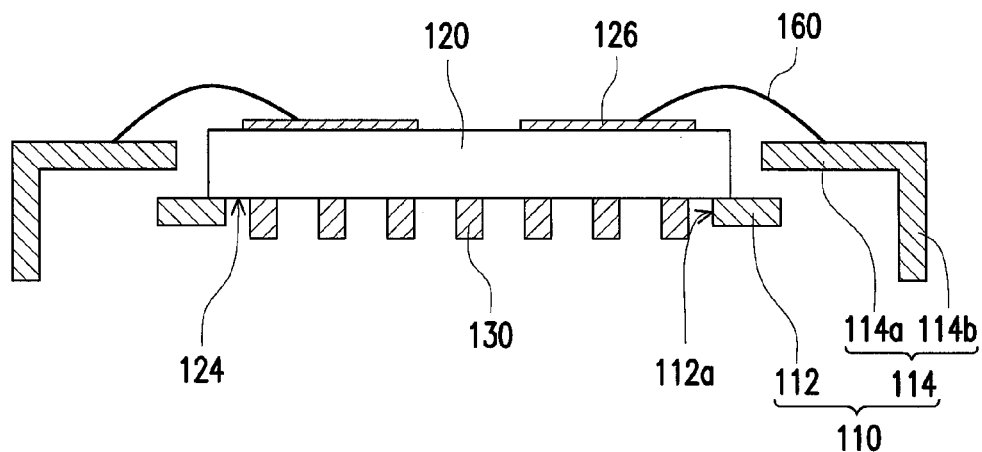

With reference to FIG. 1E, one of the chips 120 is mounted onto a die pad 112 of a leadframe 110. Here, the leadframe 110 includes the die pad 112 and a plurality of leads 114. The leads 114 surround the die pad 112, and the die pad 112 has at least one through hole 112a. The back surface 124 of the chip 120 is located on the die pad 112, and the chip 120 is electronically connected to the leads 114. To be specific, the location of the through hole 112a corresponds to the heat dissipation pillars 130; thereby, when the back surface 124 of the chip 120 is located on the die pad 112, the heat dissipation pillars 130 are able to pass through the through hole 112a. Besides, the dimension of the back surface 124 of the chip 120 should be greater than that of the through hole 112a, such that the back surface 124 of the chip 120 is able to lean against the die pad 112. According to the present embodiment, the chip 120 may be fixed onto the die pad 112 through an adhesive layer 112 and may be electrically connected to the leads 114 through a plurality of conductive wires 160. That is, the chips 120 are electrically connected to the leads 114 though wire bonding process.

Particularly, each lead 114 may include an inner lead 114a and an outer lead 114b, and the conductive wires 160 are respectively connected to the conductive pattern 126 of the chip 120 and the inner lead 114a, so as to electrically connect the chip 120 to the inner lead 114a. Besides, in the present embodiment, there is a height difference between an upper surface of the die pad 112 configured to carry the chips 120 and an upper surface of each of the leads 114a configured to be electrically connected to the chips 120. The die pad 112 of the leadframe 110 described herein has a down-set design; that is, the upper surface of the die pad 112 is lower than the upper surface of each inner lead 114a. Those with ordinary skills in the art should understand that the present embodiment and the accompanying drawings are merely exemplary and should not be construed as limitations to the invention.

Figure 1F:
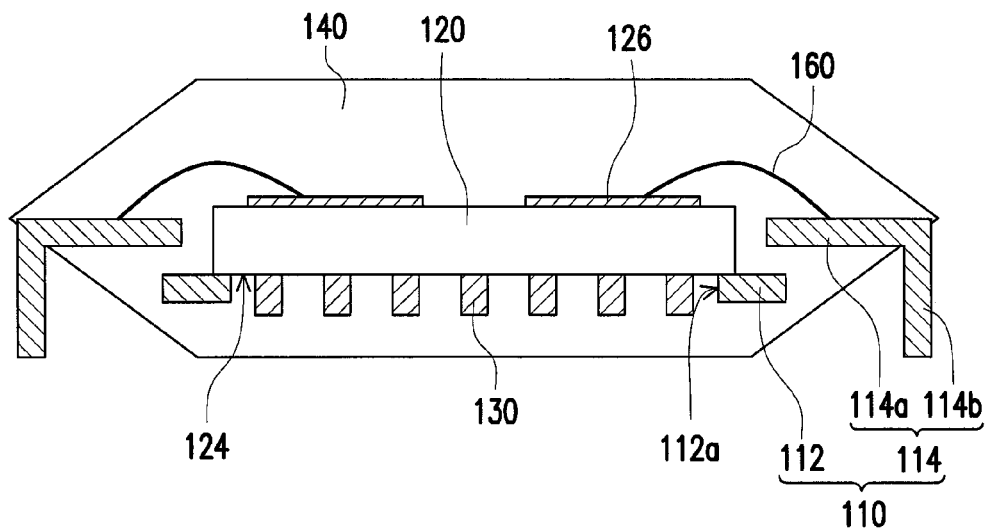
Figure 1G:
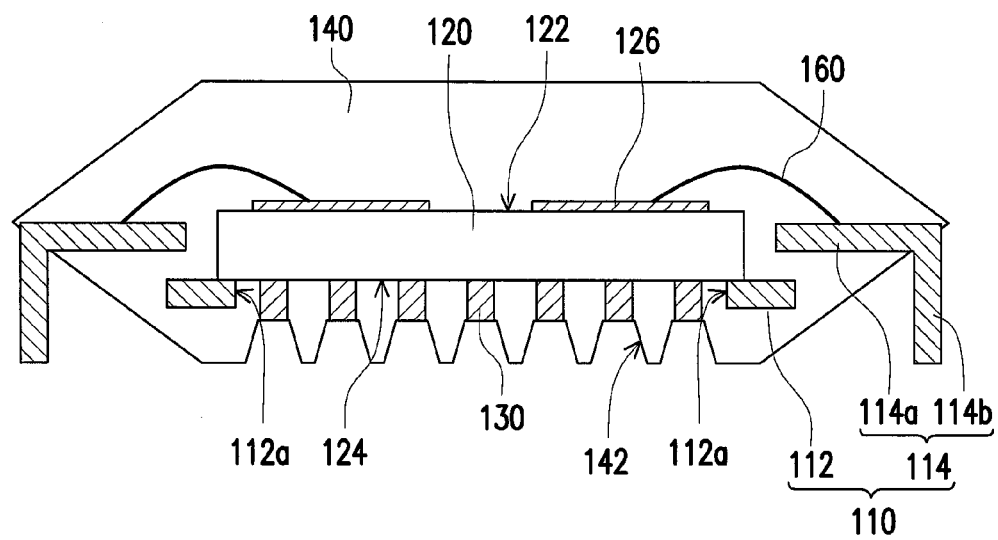

With reference to FIG. 1F, a molding compound 140 that encapsulates the chip 120 mounted on the die pad 112, at least parts of the leads 114, the head dissipation pillars 130, the conductive wires 160, and the die pad 112 is formed. According to the present embodiment, the molding compound 140 may encapsulate the inner lead 114a but expose the outer lead 114b, for instance. In FIG. 1G, a laser drill process is performed to form at least one opening 142 in the molding compound 140, so as to expose at least parts of the heat dissipation pillars 130. According to the present embodiment, the molding compound 140 at least exposes a top surface of the heat dissipation pillars 130. So far, the chip package structure 100 is substantially formed according to the present embodiment.

As shown in FIG. 1G, the chip package structure 100 that is formed by performing said manufacturing method includes a leadframe 110, a chip 120, at least one heat dissipation pillar 130, and a molding compound 140. The leadframe 110 includes a die pad 112 and a plurality of leads 114 surrounding the die pad 112. The die pad 112 has at least one through hole 112a corresponding to the heat dissipation pillar 130. The chip 120 is located on the die pad 112 and electronically connected to the leads 114. In the present embodiment, the chip 120 includes the active surface 122 and the back surface 124 opposite to the active surface 122, and the heat dissipation pillar 130 is located on the back surface 124 and passes through the through hole 112a of the die pad 112, such that the back surface 124 of the chip 120 may be adhered to the die pad 112. The molding compound 140 encapsulates the chip 120 mounted on the die pad 112, at least parts of the leads 114, and the die pad 112. Besides, the molding compound 140 includes at least one opening 142 that exposes the heat dissipation pillar 130.

Figure 4:
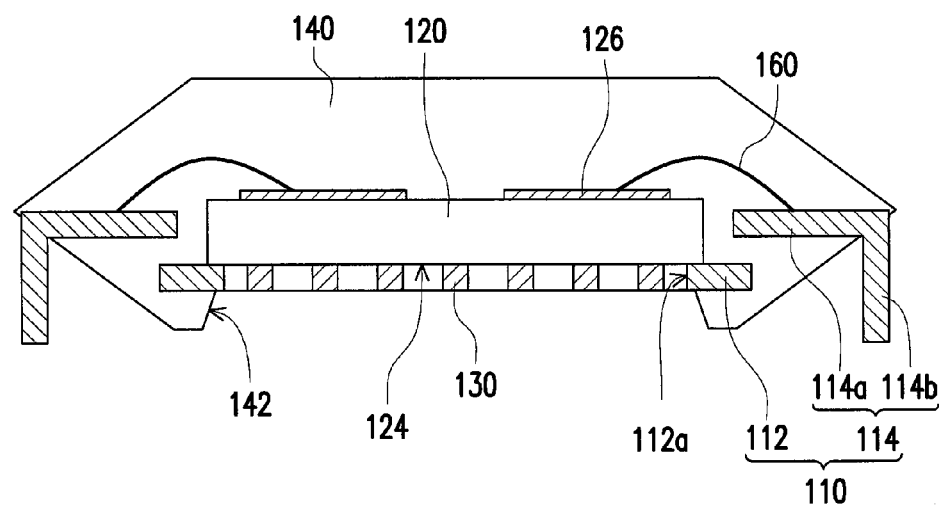
FIG. 4 is a schematic cross-sectional view illustrating a chip package structure according to another embodiment of the invention.
Figure 5:
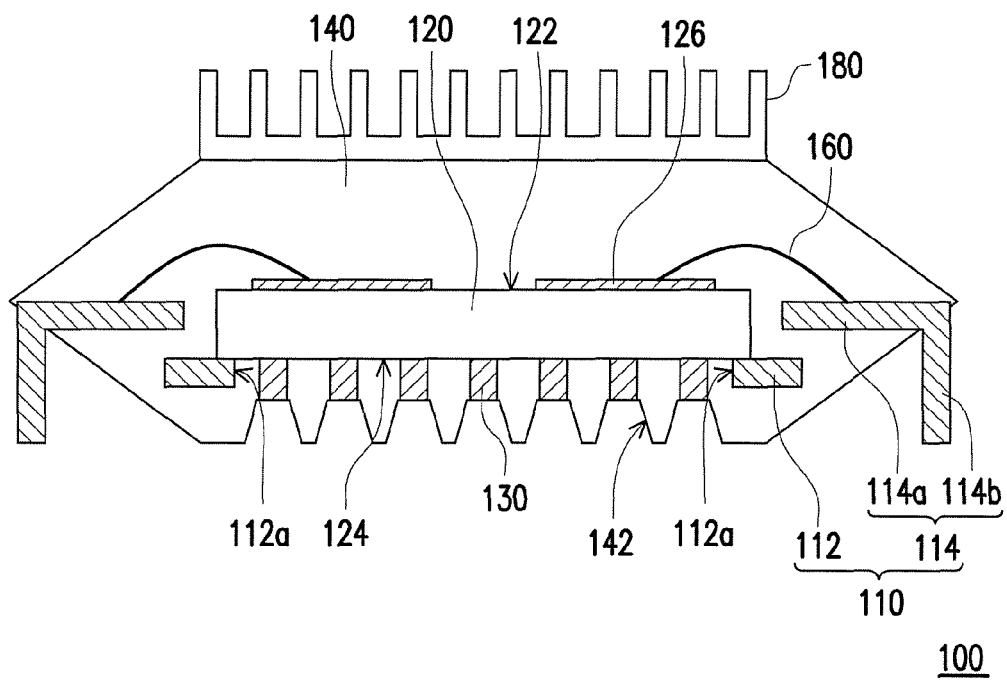
FIG. 5 is a schematic cross-sectional view illustrating a chip package structure according to another embodiment of the invention.

Said configuration allows the heat dissipated by the chip 120 to be directly dissipated to the surroundings through the heat dissipation pillar 130 located on the back surface 124 of the chip 120, so as to enhance the heat dissipation performance and reduce the costs of additional heat dissipation components, such as heat dissipation paste, heat sink, and so on. Certainly, in other embodiments of the invention, the heat sink 180 may be selectively configured on an upper surface of the molding compound 140 in the chip package structure 100 based on actual product requirements, so as to further improve the heat dissipation efficiency of the chip package structure 100. The upper surface is opposite to the opening 142. Alternatively, a portion of a lower surface of the die pad 112 may be exposed by the molding compound 140. As shown in FIG. 4, the opening 142 described herein may expose at least a portion of the die pad 112. Thereby, it is not necessary to configure any additional heat sink because the directly exposed die pad 112 may act as the heat sink. Moreover, the heat dissipation pillar 130 is located on the back surface 124 of the chip 120 and is not electrically connected to other circuits of the chip 120; therefore, although the heat dissipation pillar 130 is oxidized because the heat dissipation pillar 130 is constantly exposed to the surroundings by the molding compound 140, the electrical performance of the chip 120 is not negatively affected.

Figure 2:
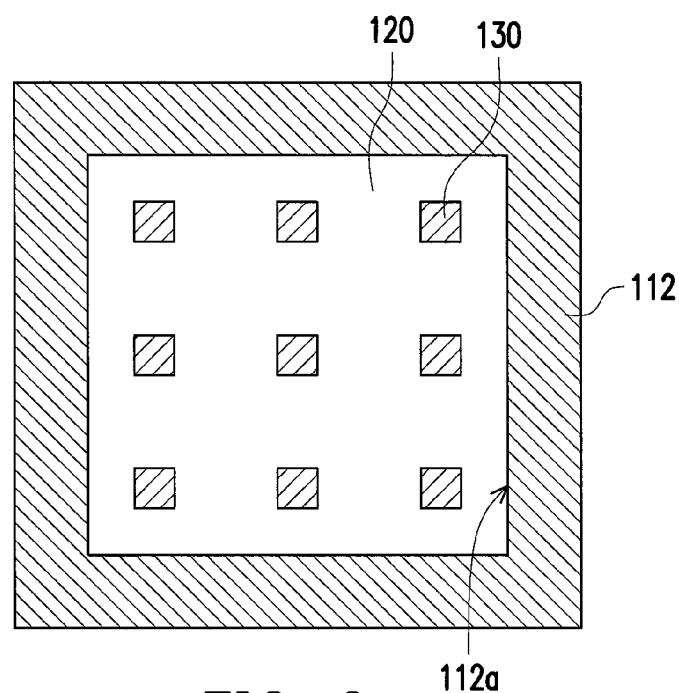
FIG. 2 is a bottom view illustrating that the chip depicted in FIG. 1G is mounted onto a die pad.

FIG. 2 is a bottom view illustrating that the chip depicted in FIG. 1G is mounted onto a die pad. It should be mentioned that the molding compound 140 shown in FIG. 1G is omitted in FIG. 2, so as to clearly show the arrangement of the chip 120 and the die pad 112. With reference to FIG. 1G and FIG. 2, in the present embodiment, the number of the heat dissipation pillars 130 is plural, the number of the through hole 112a of the die pad 112 may be one, as shown in FIG. 2, and the heat dissipation pillars 130 are all located in the through hole 112a. The number of the openings 142 of the molding compound 140 may correspond to the number of the heat dissipation pillars 130 and may be plural, and the openings 142 are respectively arranged corresponding to the heat dissipation pillars 130, so as to expose the corresponding heat dissipation pillars 130, respectively.

Figure 3:
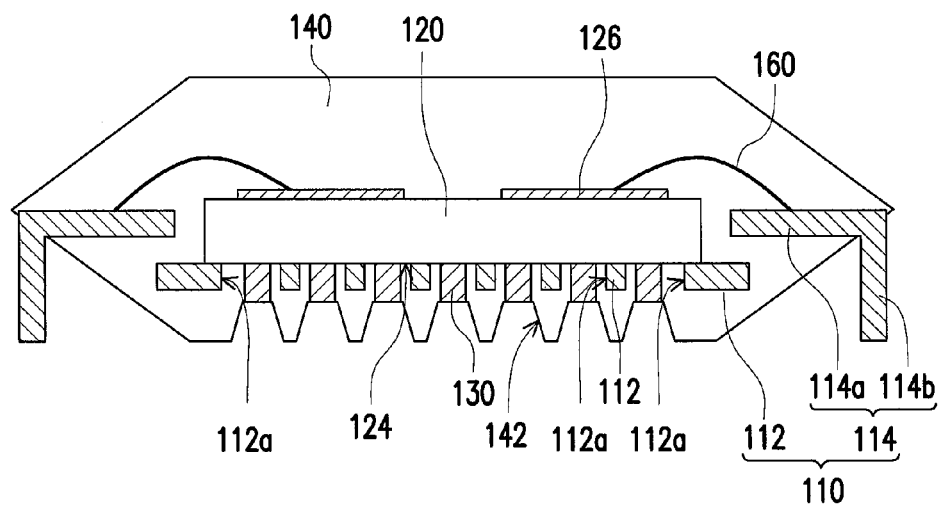
FIG. 3 is a schematic cross-sectional view illustrating a chip package structure according to an embodiment of the invention.

FIG. 3 is a schematic cross-sectional view illustrating a chip package structure according to an embodiment of the invention. It should be mentioned that the chip package structure 100a described in the present embodiment is similar to the chip package structure 100 shown in FIG. 1G, and therefore reference numbers and some descriptions provided in the previous exemplary embodiments are also applied in the following exemplary embodiment. The same reference numbers represent the same or similar components in these exemplary embodiments, and repetitive descriptions are omitted. The omitted descriptions may be referred to as those described in the previous embodiments and will not be again provided hereinafter. The differences between the chip package structure 100a and the chip package structure 100 shown in FIG. 1G are elaborated below. In the chip package structure 100a described in the present embodiment, the number of the heat dissipation pillars 130, the number of the through holes 112a of the die pad 112, and the number of the openings 142 of the molding compound 140 are all plural, and the through holes 112a and the openings 142 are respectively arranged corresponding to the heat dissipation pillars 130. That is, each of the heat dissipation pillars 130 is respectively located in the corresponding one of the through holes 112a, as shown in FIG. 3, and each of the openings 142 of the molding compound 140 exposes the corresponding one of the heat dissipation pillars 130, such that the chip package structure 100a is able to dissipate the heat generated by the chip 120 to the surroundings through the exposed heat dissipation pillars 130.

FIG. 4 is a schematic cross-sectional view illustrating a chip package structure according to another embodiment of the invention. It should be mentioned that the chip package structure 100b described in the present embodiment is similar to the chip package structure 100 shown in FIG. 1G, and therefore reference numbers and some descriptions provided in the previous exemplary embodiments are also applied in the following exemplary embodiment. The same reference numbers represent the same or similar components in these exemplary embodiments, and repetitive descriptions are omitted. The omitted descriptions may be referred to as those described in the previous embodiments and will not be again provided hereinafter. The differences between the chip package structure 100b and the chip package structure 100 shown in FIG. 1G are elaborated below.

In the present embodiment, the number of the heat dissipation pillars 130 in the chip package structure 100b is plural, and the number of the through hole 112a of the die pad 112 is one, as shown in FIG. 2 and FIG. 4. The heat dissipation pillars 130 are located in the through hole 112a. Besides, in the present embodiment, the number of the opening 142 of the molding compound 140 may be one, and the opening 142 of the molding compound 140 exposes the top surfaces of the heat dissipation pillars 130, as shown in FIG. 4, such that the chip package structure 100b is able to dissipate the heat generated by the chip 120 to the surroundings through the exposed heat dissipation pillars 130. Certainly, those with ordinary skills in the art should understand that the present embodiment and the accompanying drawings are merely exemplary, and the number of the heat dissipation pillars 130, the number of the through holes 112a, and the number of the openings 142 should not be construed as limitations to the invention. In other embodiments that are not shown in the drawings, as long as the heat dissipation pillar 130 may pass through the through hole 112a and allow the chip 120 to lean against the die pad 112, and heat dissipation pillar 130 may be exposed by the opening 142 of the molding compound 140, the previous embodiments may be implemented at will according to the product requirements.

To sum up, the heat dissipation pillar of the chip package structure is directly plated onto the back surface of the chip, and the heat dissipation pillar passes through the through hole of the die pad, such that the back surface of the chip may be adhered to the die pad of the leadframe. Besides, the molding compound includes the opening corresponding to the heat dissipation pillar, so as to expose the heat dissipation pillar. Said configuration allows the heat dissipated by the chip to be directly dissipated to the surroundings through the heat dissipation pillar located on the back surface of the chip, so as to enhance the heat dissipation performance of the chip package structure and reduce the costs of additional heat dissipation components, such as heat dissipation paste, heat sink, and so on. Certainly, in the chip package structure described in an embodiment of the invention, a heat sink may be selectively configured on the molding compound based on actual product requirements, so as to further improve the heat dissipation efficiency of the chip package structure. Moreover, the heat dissipation pillar is located on the back surface of the chip and is not electrically connected to other circuits of the chip; therefore, although the heat dissipation pillar is oxidized because the heat dissipation pillar is constantly exposed to the surroundings, the electrical performance of the chip is not negatively affected.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A chip package structure comprising:
   a leadframe comprising a die pad and a plurality of leads, the die pad having at least one through hole, the leads surrounding the die pad;
   a chip located on the die pad and electronically connected to the leads, the chip comprising an active surface and a back surface opposite to the active surface, the back surface of the chip being adhered to the die pad;
   at least one heat dissipation pillar formed by plating process and directly located on the back surface, the at least one heat dissipation pillar passing through the at least one through hole; and
   a molding compound encapsulating the chip, at least parts of the leads, and the die pad, the molding compound comprising at least one opening to expose the at least one heat dissipation pillar.

2. The chip package structure as recited in claim 1, wherein the number of the at least one heat dissipation pillar is plural.

3. The chip package structure as recited in claim 2, wherein the heat dissipation pillars are located in the at least one through hole, and the at least one opening exposes the heat dissipation pillars.

4. The chip package structure as recited in claim 2, wherein the number of the at least one opening is plural, and the openings respectively expose the heat dissipation pillars.

5. The chip package structure as recited in claim 2, wherein the number of the at least one through hole is plural, and the heat dissipation pillars are respectively located in the through holes.

6. The chip package structure as recited in claim 1, wherein the at least one opening at least exposes a bottom surface of the at least one heat dissipation pillar, wherein the bottom surface is a surface furthest from the back surface.

7. The chip package structure as recited in claim 1, further comprising a plurality of conductive wires electrically connected to the chip and the leads, respectively.

8. The chip package structure as recited in claim 1, further comprising a heat sink located on an upper surface of the molding compound, wherein the upper surface is opposite to the opening.

9. The chip package structure as recited in claim 1, wherein the at least one opening exposes at least one portion of the die pad.

10. A manufacturing method of a chip package structure, comprising:
    providing a wafer, the wafer having an active surface and a back surface opposite to the active surface, the active surface having a conductive pattern, the wafer comprising a plurality of chips connected together and arranged in an array;
    placing a patterned dry film layer on the back surface of the wafer, the patterned dry film layer having a plurality of vias;
    performing a plating process with use of the patterned dry film layer as a mask to form a plurality of heat dissipation pillars respectively in the vias;
    removing the patterned dry film layer;
    cutting the wafer to separate the chips, each of the chips having at least one of the heat dissipation pillars;
    providing a leadframe, the leadframe comprising a die pad and a plurality of leads, the die pad having at least one through hole, the leads surrounding the die pad;
    mounting one of the chips on the die pad such that at least one of the heat dissipation pillars of the one of the chips passes through the at least one through hole, and electrically connecting the one of the chips to the leads;
    forming a molding compound to encapsulate the chip mounted on the die pad, at least parts of the leads, and the die pad, the molding compound comprising at least one opening exposing at least one of the heat dissipation pillars.

11. The manufacturing method of a chip package structure as recited in claim 10, wherein the number of the at least one heat dissipation pillar of each of the chips is plural.

12. The manufacturing method of a chip package structure as recited in claim 11, wherein the heat dissipation pillars of each of the chips are located in the at least one through hole, and the at least one opening exposes the heat dissipation pillars.

13. The manufacturing method of a chip package structure as recited in claim 11, wherein the number of the at least one opening is plural, and the openings respectively expose the heat dissipation pillars.

14. The manufacturing method of a chip package structure as recited in claim 11, wherein the number of the at least one through hole is plural, and the heat dissipation pillars are respectively located in the through holes.

15. The manufacturing method of a chip package structure as recited in claim 10, wherein the at least one opening at least exposes a bottom surface of the at least one heat dissipation pillar, wherein the bottom surface is a surface furthest from the back surface.

16. The manufacturing method of a chip package structure as recited in claim 10, further comprising a plurality of conductive wires electrically connected to the chips and the leads.

17. The manufacturing method of a chip package structure as recited in claim 10, further comprising a heat sink located on an upper surface of the molding compound, wherein the upper surface is opposite to the opening.

18. The manufacturing method of a chip package structure as recited in claim 10, wherein the at least one opening exposes at least one portion of the die pad.

* * * * *